United States Patent
Kim et al.

(10) Patent No.: US 7,611,182 B2
(45) Date of Patent: Nov. 3, 2009

(54) WAFER TRANSFER APPARATUS

(75) Inventors: Woo-Young Kim, Cheonan-si (KR); In-Ho Bang, Cheonan-si (KR); Taek-Youb Lee, Daejeon-Gwangyeoksi (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 11/064,856

(22) Filed: Feb. 25, 2005

(65) Prior Publication Data

US 2006/0192400 A1    Aug. 31, 2006

(51) Int. Cl.
    *B65G 49/07*    (2006.01)
(52) U.S. Cl. .................................. 294/103.1; 414/941
(58) Field of Classification Search .................. 294/1.1, 294/103.1; 414/941
    See application file for complete search history.

(56) References Cited

U.S. PATENT DOCUMENTS

| | | | |
|---|---|---|---|
| 5,133,635 A * | 7/1992 | Malin et al. .............. | 414/744.8 |
| 5,810,935 A * | 9/1998 | Lee et al. .................... | 414/936 |
| 6,216,883 B1 * | 4/2001 | Kobayashi et al. .......... | 414/941 |
| 6,256,555 B1 * | 7/2001 | Bacchi et al. ................ | 700/245 |
| 6,623,235 B2 * | 9/2003 | Yokota et al. ............. | 414/744.8 |
| 6,769,861 B2 * | 8/2004 | Caveney ...................... | 414/783 |
| 6,913,302 B2 * | 7/2005 | Yokota et al. ............. | 294/103.1 |
| 7,140,655 B2 * | 11/2006 | Kesil et al. .................... | 294/104 |
| 2002/0042666 A1 | 4/2002 | Bacchi et al. | |
| 2005/0017529 A1 * | 1/2005 | Rogers et al. ............ | 294/103.1 |
| 2007/0216179 A1 * | 9/2007 | Hirooka et al. .......... | 294/103.1 |

FOREIGN PATENT DOCUMENTS

| | | |
|---|---|---|
| CN | 2361843 Y | 2/2000 |
| CN | 1336008 A | 2/2002 |
| JP | 63-144984 | 12/1986 |
| JP | 1995-71510 | 3/1995 |
| JP | 11-354605 A | 12/1999 |
| JP | 2000-012656 | 1/2000 |
| JP | 2000-077494 A | 3/2000 |
| JP | 2000-133692 A | 5/2000 |
| JP | 2000-343475 | 12/2000 |
| JP | 2002-141395 | 5/2002 |
| JP | 2002-184853 | 6/2002 |
| JP | 2002-252268 A | 9/2002 |
| JP | 2002-264065 A | 9/2002 |
| JP | 1020030097286 * | 12/2003 |
| JP | 2004-006534 | 1/2004 |
| JP | 2004-119554 | 4/2004 |
| KR | 10-2000-0016059 | 3/2000 |
| KR | 1020010006901 A | 1/2001 |
| KR | 10-2002-0034587 | 6/2002 |

* cited by examiner

*Primary Examiner*—Paul T Chin
(74) *Attorney, Agent, or Firm*—Harness, Dickey & Pierce, P.L.C.

(57) ABSTRACT

A wafer transfer apparatus may include a robot arm unit configured to be operated by a driving means, a blade configured to support a wafer and having a fix finger at a first end, and a clamping member attached to the robot arm. The clamping arm may also include a movable finger configured to hold a peripheral edge of the wafer, and a moving pusher attached to the movable finger and configured to guide the movable finger and the wafer on the blade towards the fix finger.

12 Claims, 6 Drawing Sheets

(a)  (b)

(a)  (b)

| Normal or Abnormal | | | First Sensor | Second Sensor | Third Sensor |
|---|---|---|---|---|---|
| Standby | Normal | | On | Off | Off |
| | Abnormal | | Except Standby | | |
| Holding | Normal | | Off | Off | On |
| | Abnormal | Broken | Off | On | Off |
| | | Separated | Off | On | On | is controlled by driving means, a blade on which a wafer is placed, and a clamping member for locating the wafer placed on the blade in position while fixing the wafer. The blade is installed at the end of the robot arm unit, and the clamping is installed at the blade.

WAFER TRANSFER APPARATUS

FIELD OF THE INVENTION

The present invention relates to a wafer transfer apparatus and, more particularly, to a wafer transfer apparatus having cylinder-driving movable fingers.

BACKGROUND OF THE INVENTION

Semiconductor wafers are transferred to locations where processes (e.g., cleaning, deposition, etching, etc.) are carried out. Therefore, various wafer transfer apparatuses have been used.

Generally, wafer transfer apparatuses used at an atmospheric pressure fix substrates using vacuum. Since a wafer transfer apparatus used in a high vacuum system cannot use vacuum, a shoe is mounted on front and rear edges of a plate on which a wafer is placed. Thus, wafers may be separated from blades when they are transferred at a high speed. Further, there was no method for correcting wafers that are disposed to swerve from blades.

In recent years, means for clamping wafers placed on blades have been developed so as to fix the wafers stably. Nevertheless, the clamping means has a complex structure and thus it is hard to regulate the structure of the clamping means. Moreover, wafers may be damaged by the clamping means.

SUMMARY OF THE INVENTION

A feature of the present invention is to provide a wafer transfer apparatus which transfers wafers in a high-vacuum chamber at a high speed and corrects locations of swerving wafers.

Another feature of the present invention is to provide a wafer transfer apparatus which prevents breakage of held wafers.

Further another feature of the present invention is to provide a wafer transfer apparatus having a simple structure.

Still another feature of the present invention is to provide a wafer transfer apparatus which checks whether In order to achieve these features, the present invention provides a wafer transfer apparatus includes a robot arm unit whose operation is controlled by driving means, a blade on which a wafer is placed, and a clamping member for locating the wafer placed on the blade in position while fixing the wafer. The blade is installed at the end of the robot arm unit, and the clamping is installed at the blade.

In some embodiments, the blade includes a fix finger. The clamping member includes a moving pusher for pushing the wafer placed on the blade toward the fix finger, a driving part for slidingly moving the moving pusher, and a case where the driving part is installed.

In some embodiments, the driving part comprises a pneumatic cylinder.

In some embodiments, the wafer transfer apparatus further includes a sensing unit for sensing the location of the pneumatic cylinder to determine whether wafers are held normally or separated.

In some embodiments, the location of the pneumatic cylinder is divided into standby, holding, and separating sections. The sensing unit includes a first sensor for sensing whether the cylinder is in the standby section, a second sensor for sensing that the cylinder is separated from the holding section to be in the separating section, and a third sensor for sensing whether a wafer is placed on the blade.

In some embodiments, the moving pusher includes a connecting rod connected to a moving axis of the driving part, a pair of supporters extending from both sides of the connecting rod, and a movable finger contacting the edge of a wafer to support the wafer. The movable finger is installed at the pair of the supporters. The clamping means further includes at least one stopper for regulating a moving distance of the moving pusher.

In some embodiments, the stopper is coupled with the case like a screw. The location of the stopper may be regulated.

In some embodiments, the wafer transfer apparatus further includes a spring for controlling a moving speed of the moving pusher to absorb a shock produced when the moving pusher contacts the wafer.

DETAILED DESCRIPTION OF THE INVENTION

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
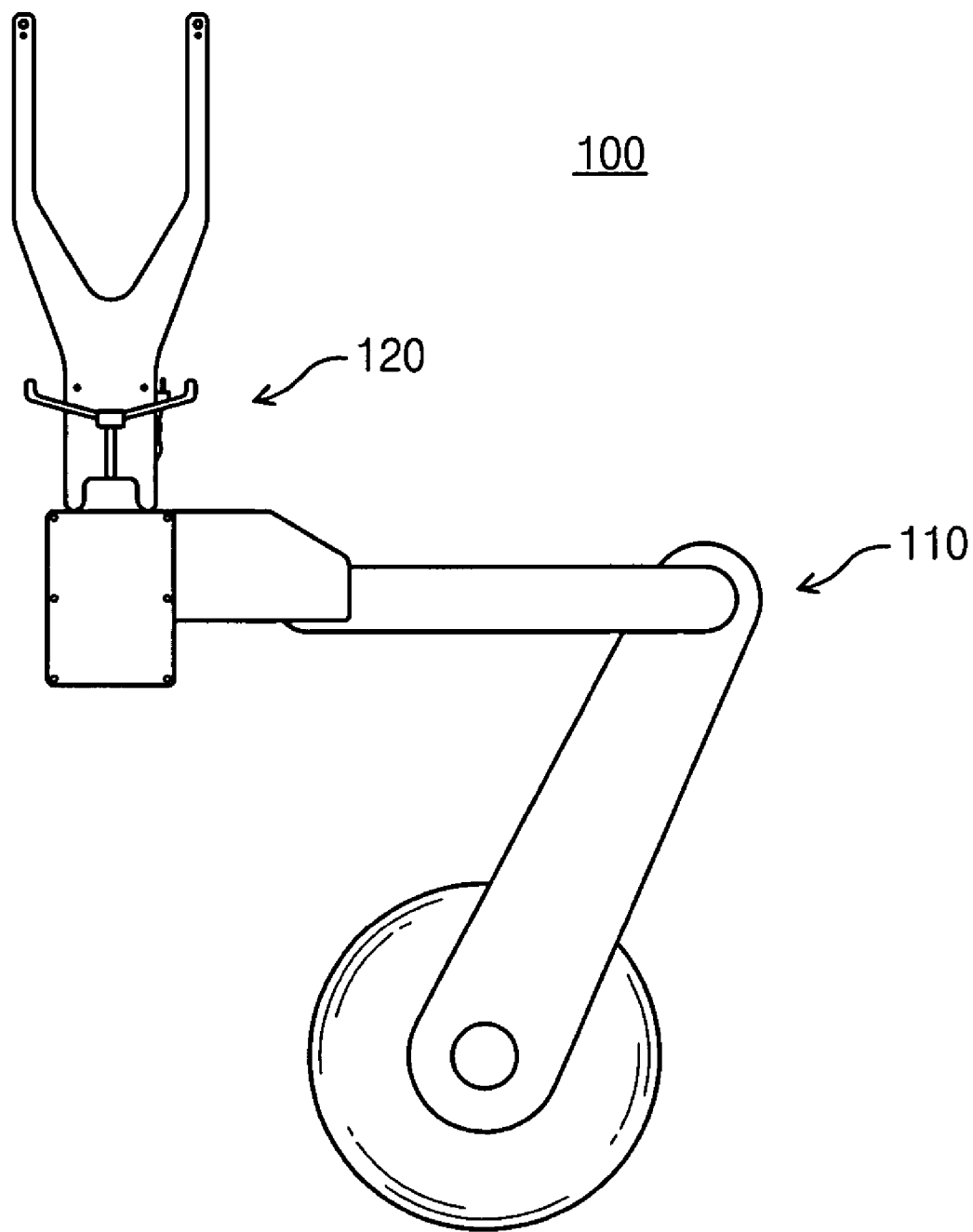
FIG. 1 is a top plan view of a wafer transfer apparatus according to the present invention.
Figure 2:
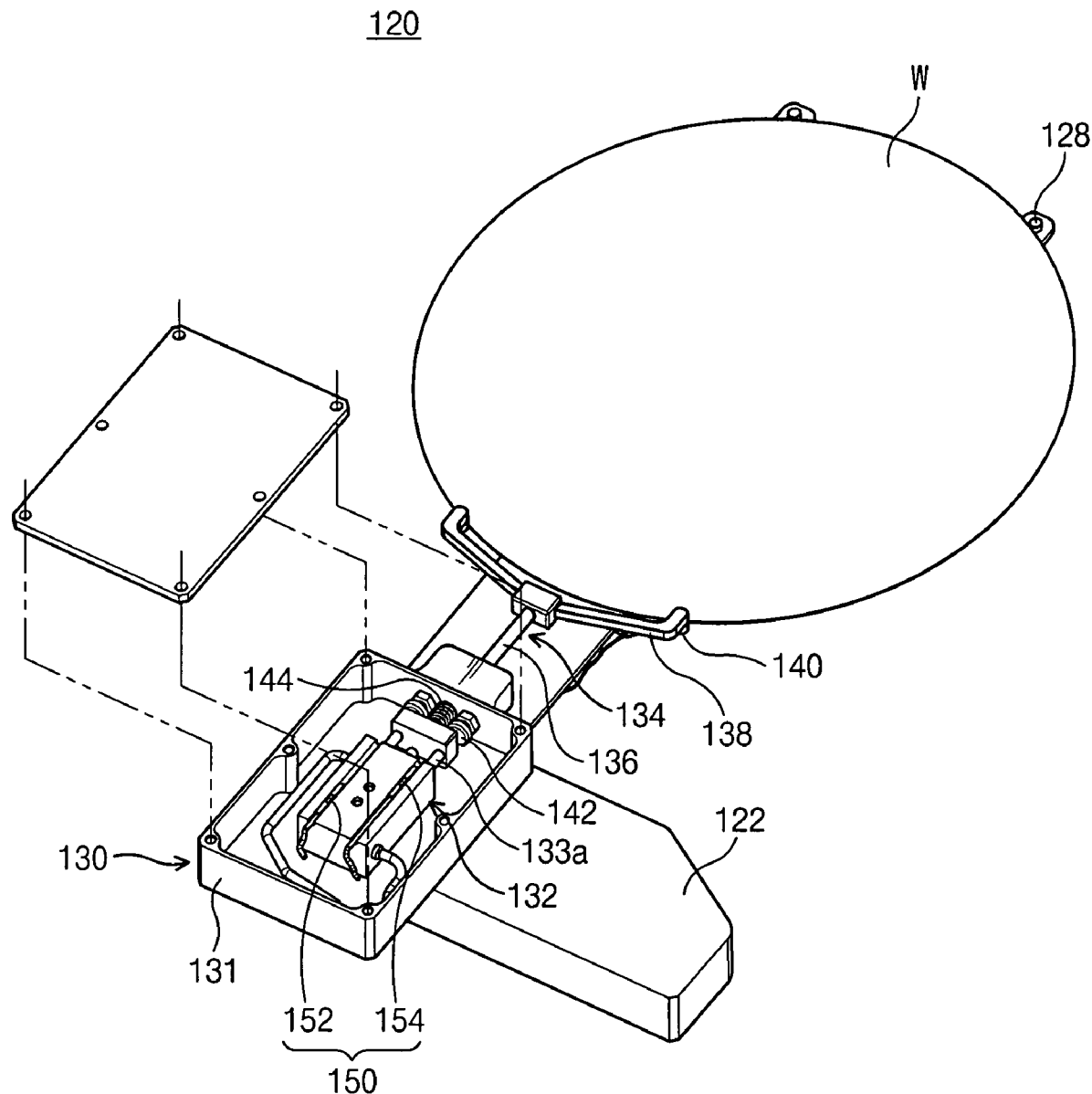
FIG. 2 is a perspective view of a blade illustrated in FIG. 1.
Figure 3:
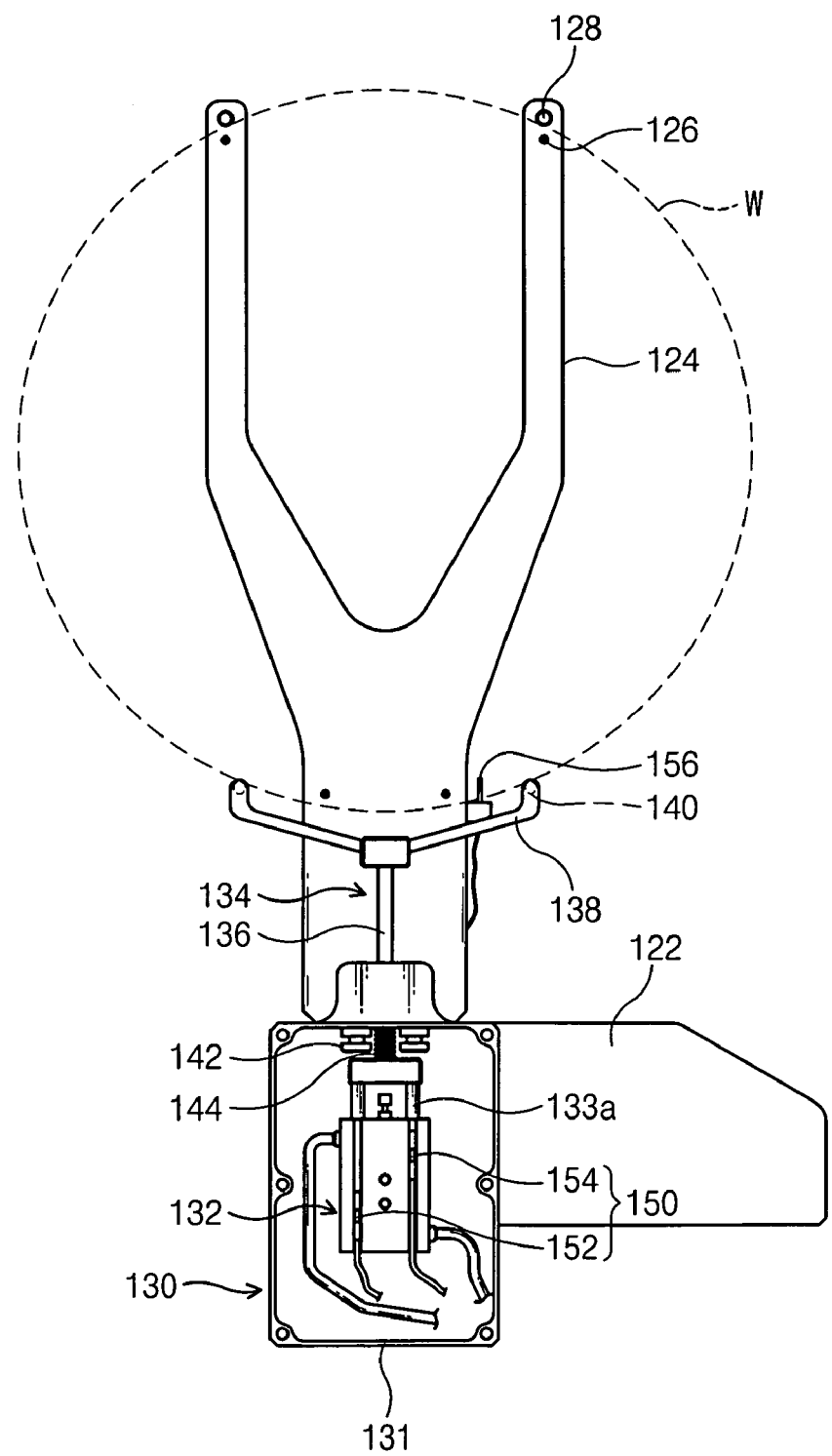
FIG. 3 is a top plan view of the blade illustrated in FIG. 1.
Figure 4:
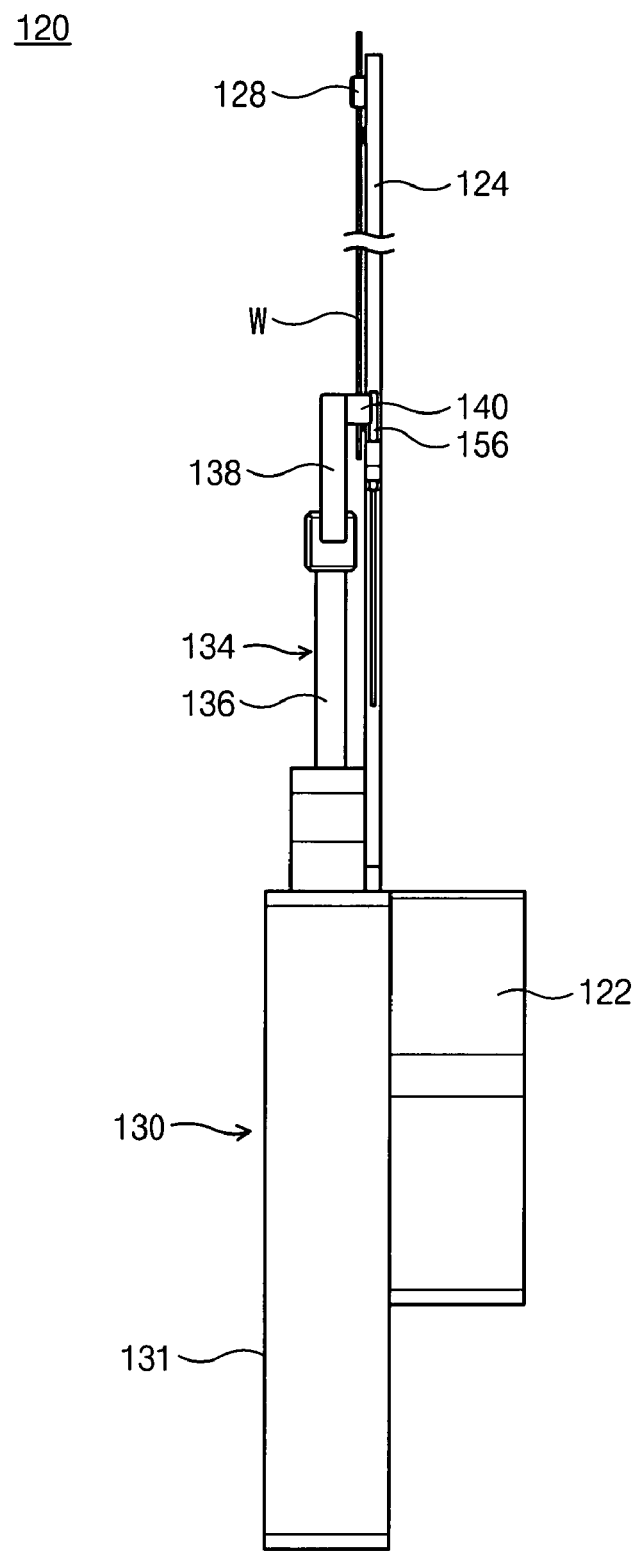
FIG. 4 is a side view of the blade illustrated in FIG. 1.

FIG. 1 is a top plan view of a wafer transfer apparatus according to the present invention, and FIG. 2 through FIG. 4 are views for explaining a configuration of a blade illustrated in FIG. 1.

As illustrated in FIG. 1, a wafer transfer apparatus 100 has a robot arm unit 110 and a blade 120. The operation of the robot arm unit 110 is controlled by driving means (not shown) such as, for example, stepping motor. A semiconductor wafer 200 is placed on the blade 120.

The blade 120 is fixedly coupled to a terminal of the robot arm unit 110.

Referring to FIG. 1 through FIG. 4, the blade 120 is Y-shaped in general and has a coupling part 122 and a pair of wings 124. The coupling part 122 is coupled to a terminal of the robot arm unit 110. The wing 124 topers away from the coupling part 122 to the end of the wing 124. A fix finger 128 is installed at the end of the wing 124. Four support protrusions 126 are mounted on the wing 124 to support the bottom of a wafer.

The coupling part 122 has a clamping member 130 for stably clamping wafers onto the wing 124 and a sensing unit 150 for determining whether the wafers are normal.

The clamping member 130 places the wafer "W" in position while fixing the same and includes a moving pusher 134, a pneumatic cylinder 132 acting as a driving part, and a case 131.

The moving pusher 134 pushes a wafer "W" placed on the blade 120 toward the fix finger 128 and has a connecting rod 136 connected to a moving axis 133a of the pneumatic cylinder 132 and a pair of supporters 138 extending from both sides of the connecting rod 136. A movable finger 140 is installed at the end of the supporter 138 to be in contact with the edge of a wafer.

Figure 5:
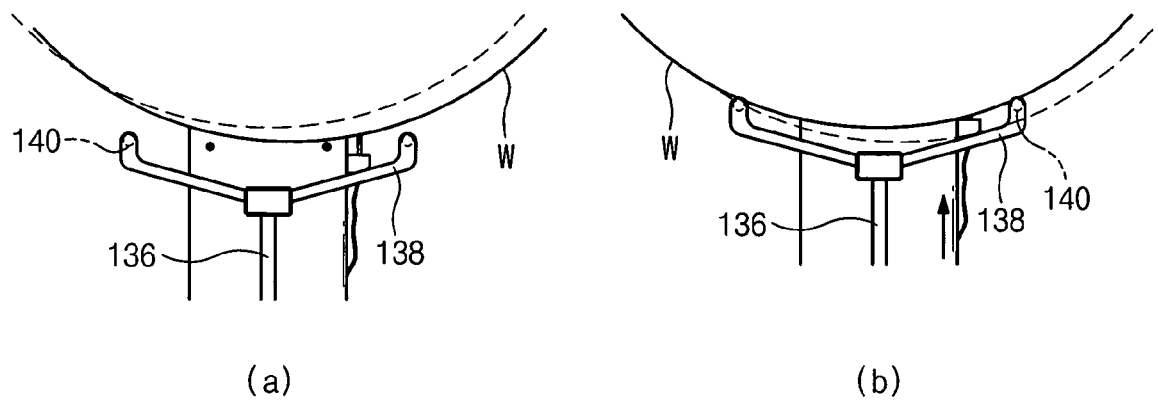
FIG. 5 shows steps of regulating a wafer centering while movable fingers of a moving pusher move forward.

The moving pusher 134 is fully moved backward by the pneumatic cylinder 132. If not, a misaligned wafer may collide with the moving pusher 134 when being placed on the blade 120. The moving pusher 134 is moved forward by the pneumatic cylinder 132. At the forward-moving location of the moving pusher 134, the movable finger 140 and the fix finger 128 are in contact with the edge of a wafer to support the wafer. As illustrated in FIG. 5, if a wafer "W" is erroneously placed on the blade 120 (the center of the wafer "W" swerves slightly), movable fingers of the moving pusher 134 move forward to regulate a centering of the wafer "W".

Figure 6:
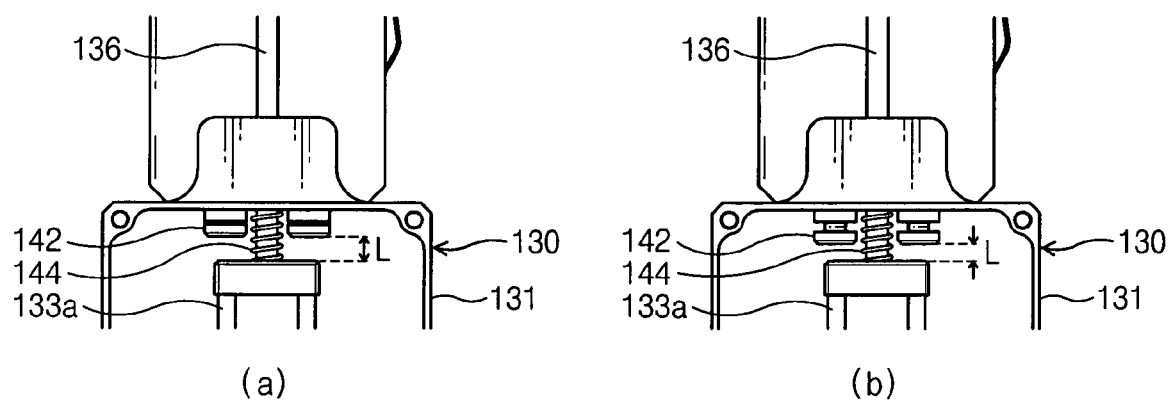
FIG. 6 shows the example that a forward-moving distance of a moving pusher is regulated using a stopper.

The clamping member 130 has a stopper 142 for regulating a moving distance (moving-toward distance) "L" of the moving pusher 134. The stopper 142 is installed in the case 131 to regulate a moving-toward distance of the moving pusher 134. Particularly, the stopper 142 is coupled with the case 131, like a screw, to regulate the forward-moving distance of the moving pusher 134, if necessary. The location of the stopper 142 must be regulated because the clamping location of a wafer may vary with a degree of expansion and contraction of the wafer. FIG. 6 shows the example that a forward-moving distance of a moving pusher is regulated using a stopper.

The clamping member 130 has a spring 144 for shock absorption. The spring 144 is installed at a connecting rod 136 of the moving pusher 134, absorbing a shock applied to a wafer when the moving pusher 134 moves forward to be in contact with the wafer.

According to the present invention, the wafer transfer apparatus may prevent a wafer damage that may occur while holding the wafer. Preventing the wafer damage may be accomplished through the steps as follows: (1) a speed of the moving pusher 134 may be controlled using a pneumatic cylinder; (2) the speed of the moving pusher 134 may be reduced using a spring 144; and (3) a forward-moving location of the moving pusher 134 is regulated using a stopper 142.

Figures 7, 8:
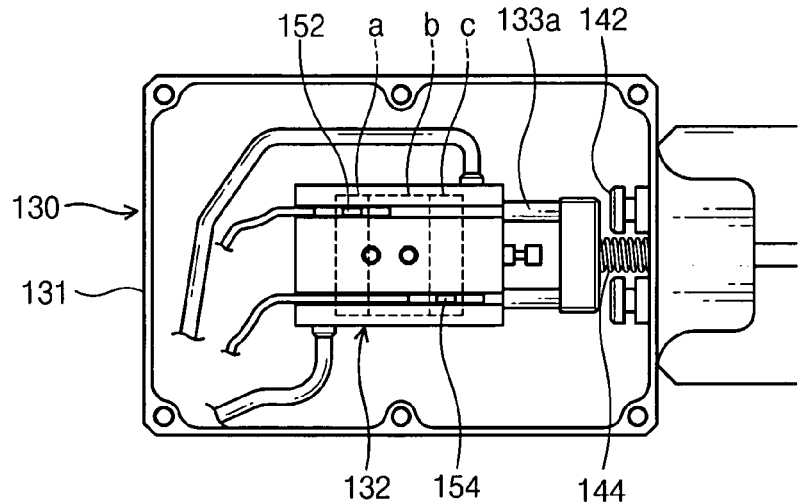
FIG. 7 shows a hydraulic cylinder in which first and second sensors are installed.
FIG. 8 is a table for explaining a method of determining whether a wafer using sensors of a sensing unit is normal.

Referring to FIG. 3 and FIG. 7, the sensing unit 150 has first to third sensors 152, 154, and 156. The first and second sensors 152 and 154 sense the location of a pneumatic cylinder, and the third sensor 156 detects whether a wafer "W" is placed on a blade 120. The wafer transfer apparatus 100 according to the invention may check whether wafers are normal, using the sensors 152, 154, and 156. As illustrated in FIG. 7, the location of the pneumatic cylinder 132 is divided into a standby section "a", a holding section "b", and a separating section "c". The first sensor 152 senses a cylinder disposed at the standby section "a", and the second sensor 154 senses a cylinder disposed at the separating section "c". As illustrated in FIG. 8, a sensing unit determines whether wafers are normal or abnormal (standby normal, standby abnormal, holding normal, holding broken, and holding separated).

In the present invention, the above-mentioned wafers include substrates for a reticle, display panel substrates such as substrates for liquid display panel and substrates for plasma display panel, substrates for hard disk, and wafers for electronic devices such as semiconductor devices.

As explained so far, wafers incorrectly placed on blades are corrected (regulated in position) to precisely move to the next location. Since wafers are physically supported (held) at four or more points, they are transferred at a high speed and do not drop. Further, a plurality of sensors are used to sense whether wafers are broken or separated.

Other modifications and variations to the invention will be apparent to a person skilled in the art from the foregoing disclosure. Thus, while only certain embodiment of the invention has been specifically described herein, it will be apparent that numerous modifications may be made thereto without departing from the spirit and scope of the invention.

What is claimed is:

1. A wafer transfer apparatus comprising:
 a robot arm unit;
 a blade having two end portions, one end portion operably connected to the robot arm unit, the second end portion having a fix finger at a peripheral edge thereof, and the blade configured to support a wafer;
 a clamping arm attached to the robot arm unit, the clamping arm including:
  a movable finger configured to engage and disengage a peripheral edge of a wafer,
  a moving pusher attached to the movable finger at a first end and configured to guide the movable finger and the wafer on the blade towards the fix finger; and
  a case including at least one stopper configured to regulate the movement of the moving pusher, wherein the at least one stopper is a screw, and a spring for controlling a speed of the moving pusher and configured to absorb a shock produced when the moving pusher contacts the wafer.

2. The wafer transfer apparatus of claim 1, wherein the clamping arm further comprises:
 a driving part configured to slide the moving pusher; and
 the case configured to house the driving part therein.

3. The wafer transfer apparatus of claim 2, wherein the driving part comprises a pneumatic cylinder.

4. The wafer transfer apparatus of claim 3, further comprising:
 a sensing unit adapted to determine a location of the pneumatic cylinder.

5. The wafer transfer apparatus of claim 4, wherein the location of the pneumatic cylinder is divided into standby, holding, and separating sections.

6. The wafer transfer apparatus of claim 5, wherein the sensing unit comprises:
 a first sensor for determining whether the pneumatic cylinder is in the standby section; and
 a second sensor for determining whether the pneumatic cylinder is separated from the holding section thereby being in the separating section.

7. The wafer transfer apparatus of claim 6, wherein the sensing unit further comprises:
 a third sensor for determining whether the wafer is placed on the blade.

8. The wafer transfer apparatus of claim 4, wherein the sensing unit adapted to determine whether the wafer is standby normal, standby abnormal, holding normal, holding broken, or holding separated.

9. The wafer transfer apparatus of claim 1, wherein the moving pusher comprises:
 a connecting rod connected to a moving axis of the driving part; and a pair of supporters extending from both sides of the connecting rod.

10. The wafer transfer apparatus of claim 1, wherein the stopper is regulated to control a distance with the wafer.

11. The wafer transfer apparatus of claim 1, wherein the spring is disposed between a case and the moving axis.

12. The wafer transfer apparatus of claim 1, wherein the blade has a plurality of support protrusions for supporting the wafer.

* * * * *